United States Patent [19]

McMurray

[11] Patent Number: 4,686,618
[45] Date of Patent: Aug. 11, 1987

[54] FAULT PROTECTION FOR GTO VOLTAGE-SOURCE INVERTERS

[75] Inventor: William McMurray, Schenectady, N.Y.

[73] Assignee: General Electric Company, Schenectady, N.Y.

[21] Appl. No.: 840,176

[22] Filed: Mar. 17, 1986

[51] Int. Cl.$^4$ .............................................. H02H 7/122
[52] U.S. Cl. ...................... 363/58; 363/137; 361/57; 361/100
[58] Field of Search .................... 363/55–58, 363/135–138, 68, 96; 361/54, 57, 93, 100

[56] References Cited

U.S. PATENT DOCUMENTS 3,538,419  11/1970  Seki et al. ............................ 363/138
4,005,350   1/1977  Brenneisen ........................... 363/58
4,156,274   5/1979  Fukui et al. .......................... 363/58

OTHER PUBLICATIONS

T. Asaeda et al., "DC-to-AC Power Converter for Fuel Cell System", Conference Record of Fifth International Telecommunications Energy Conference, Oct., 1983, pp. 84–91.

Primary Examiner—Peter S. Wong
Attorney, Agent, or Firm—Marvin Snyder; James C. Davis, Jr.

[57] ABSTRACT

A crowbar circuit is provided in an inverter for diverting overcurrents from the inverter switches. The crowbar circuit includes a crowbar switch and a crowbar winding which is magnetically coupled with the inverter snubber reactors. The size and the coupling of the crowbar winding are chosen so as to reduce or make negative the di/dt of the snubber reactors when the crowbar switch is turned on.

19 Claims, 7 Drawing Figures

FAULT PROTECTION FOR GTO VOLTAGE-SOURCE INVERTERS

BACKGROUND OF THE INVENTION

The present invention relates in general to a new and useful method and apparatus for protecting inverter semiconductor switches from overcurrent faults, and more specifically to diverting fault current from the inverter switches to a crowbar circuit which is sized to handle the overload.

Certain well-known types of power converters are comprised of one or more converter phase legs, each leg including an even number of semiconductor switching devices connected in series. The central junction of each leg comprises the output of that leg. The phase leg semiconductor switches are turned on and off in a manner which provides an AC output voltage at the converter outputs.

Controlled turn-off devices, such as gate turn-off thyristors (GTOs), bipolar power transistors and power field-effect transisitors (FETs), are widely used for the inverter switches. To reduce losses in the converter and to protect the inverter switches, each switch is associated with a series inductive snubber to limit the rate of change of current with respect to time (di/dt) when turning on and a shunt capacitive snubber to limit the rate of change of voltage with respect to time (dv/dt) when turning off.

Fault conditions in a power converter which result in a large overcurrent flowing in the inverter phase leg switches can be caused, for example, by a short-circuit in the ac load or by a malfunction which turns on simultaneously all of the switches in a phase leg. This overcurrent is detected and, in response, the inverter switches must be turned off as quickly and as soon as possible. However, the current that can be turned off by gate turn-off tyristors or other power semiconductor switching devices is limited, and any attempt to turn off a higher current will destroy the device. If no attempt to turn off is made, the surge current discharging the input filter capacitor of the inverter may exceed the capability of the switching device.

Accordingly, it is a principal object of the present invention to improve the operation of voltage-source inverters.

It is another object of the invention to provide overcurrent fault protection in a manner that does not interfere with normal inverter operation.

It is a further object of the invention to provide a method and apparatus for quickly diverting fault current from an inverter phase leg to a crowbar circuit, thus protecting the phase leg switches from damage due to overcurrents.

It is yet another object to provide inverter overcurrent fault protection with few extra components and with low cost.

SUMMARY OF THE INVENTION

These and other objects are achieved by a phase leg of an inverter comprising phase leg switches, inductive snubber means, a crowbar inductance and a crowbar switch. A plurality of series-connected phase leg switches are included for coupling to a dc power supply and for providing an ac output. An inductive snubber means for limiting di/dt during turn-on of the phase leg switches is connected in series with the phase leg switches and has an inductance $L_1$.

The crowbar inductance has an inductance $L_2$ and is magnetically coupled to the inductive snubber means with a mutual inductance M. The crowbar switch is connected in series with the crowbar inductance and is adapted to be turned on upon the onset of an overcurrent fault. The inductances $L_1$, $L_2$ and M cooperatively reduce the rate of current increase in the phase leg switches when the crowbar switch is turned on.

In another aspect, the invention is embodied in a method for providing overload protection in a voltage-source inverter connected to a dc supply voltage $e_1$, comprising the steps of (1) detecting an overcurrent fault, (2) turning on the crowbar switch so that current flows in the crowbar inductance and so a voltage $e_2$ appears cross the crowbar inductance, and (3) turning off the phase leg switches by reducing current in the inductive snubber means to substantially zero by virtue of the inductances $L_1$, $L_2$ and M satisfying the relationship $L_2(e_1/e_2) < M < L_1(e_2/e_1)$.

BRIEF DESCRIPTION OF THE DRAWINGS

The novel features of the invention are set forth with particularity in the appended claims. The invention itself, however, as to organization and method of operation, together with further objects and advantages thereof, may best be understood by reference to the following description takin in conjunction with the accompanying drawings in which:

DETAILED DESCRIPTION OF THE INVENTION

Figure 1:
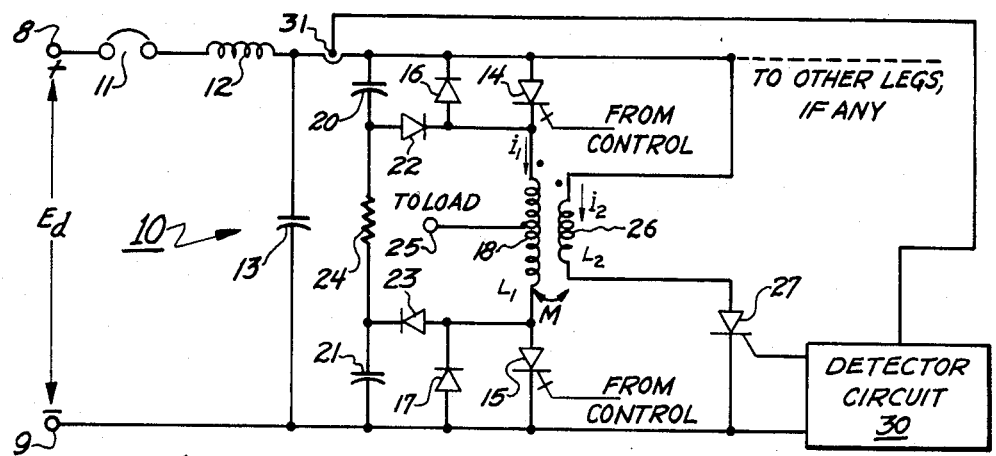
FIG. 1 is a schematic diagram of a power converter showing a single phase leg employing the crowbar circuit of the inventon.

FIG. 1 shows a power converter 10 having overcurrent fault protection in connection with a single inverter phase leg. A pair of input terminals 8 and 9 are adapted to receive a DC input voltage $E_d$ from a DC supply (not shown). A main power switch 11 is conncted to terminal 8 and may comprise, for example, a circuit breaker. A high frequency filter inductor 12 is connected to circuit breaker 11 and to a main filter capacitor 13. A phase leg including GTO inverter switches 14 and 15 is connected across capacitor 13. The single phase leg shown can be used in a half-bridge inverter or more phase legs may alternatively be added to form a full-bridge inverter or a polyphase inverter. GTOs 14 and 15 are turned on and off by a conventional control circuit (not shown) to produce an AC output signal.

Feedback diodes 16 and 17 are connected in inverse-parallel with GTOs 14 and 15, respectively. A capacitive snubber means includes capacitors 20 and 21 coupled across GTOs 14 and 15, respectively. Polarizing diodes 22 and 23 and a resistor 24 are coupled to snubber capacitors 20 and 21 and snubber inductor 18 to discharge the energy stored in the snubbers. Operation of the snubber elements is described for example in T. Asaeda et al., "DC-to-AC Power Converter for Fuel Cell System", Conf. Record of Fifth International Telecommunications Energy Conf. (INTELEC), October 1984, pp 84-91. An output terminal 25 is connected to the center tap of inductor 18 and provides the ac output of the phase leg. The inductive snubber could alternatively be comprised of separate inductors with terminal 25 being connected to the central junction of the phase leg.

Crowbar circuitry is connected across main filter capacitor 13 and includes a crowbar inductance 26 and a crowbar switch 27 (shown as an ordinary thyristor). Crowbar switch 27 is controlled by a detector circuit 30 which is also connected to a current sensor 31 coupled between capacitor 13 and the phase leg to measure current in the inverter. Thus, detector circuit 30 turns on crowbar switch 27 when the measured current exceeds a predetermined magnitude (i.e. overcurrent) to protect GTOs 14 and 15 from the overcurrent. Detector circuit 30 may comprise, for example, a voltage comparator for comparing the output signal of current sensor 31 with a current reference.

In a principal aspect of the invention, inductive snubber 18 is magnetically coupled with crowbar inductance 26. Inductor 18 has an inductance $L_1$, crowbar inductance 26 has an inductance $L_2$ and their mutual inductance is M. By introducing mutual inductance M, it is possible to more quickly reduce current in the phase leg as opposed to the crowbar action which would result from direct connection of crowbar switch 27 across the phase leg, since mutual inductance M can alter the current response of the phase leg when current flows in the crowbar inductance.

In order to obtain a favorable influence on the phase leg current, certain conditions with respect to $L_1$, $L_2$ and M must be met. These conditions can be determined as follows. Assume that a current $i_1$ is flowing in snubber inductor 18. When crowbar switch 27 is turned on due to an overcurrent fault, a current $i_2$ begins to flow in crowbar inductance 26. If e is the instantaneous voltage across both the crowbar path and filter capacitor 13 and neglecting resistance, each of the currents are determined by the simultaneous differential equations:

$$e = L_1(di_1/dt) + M(di_2/dt)$$

and $$e = L_2(di_2/dt) + M(di_1/dt).$$

By equating the two expressions and using substitution, solutions for the current derivatives are:

$$di_1/dt = e(L_2 - M)/(L_1 L_2 - M^2)$$

and $$di_2/dt = e(L_1 - M)/(L_1 L_2 - M^2).$$

The larger the positive value of $di_2/dt$, then the greater the favorable reduction of $di_1/dt$ (i.e. to a lower value) when crowbar switch 27 is turned on. For $di_2/dt$ greater than zero, we have $e(L_1-M)/(L_1L_2-M^2)$ also greater than zero. This implies that $L_1$ must be greater than M.

Satisfying the condition that $L_1 > M$ ensures that $di_1/dt$ is reduced to at least a smaller positive value. However, it does not ensure a negative value for $di_1/dt$. In another embodiment of the invention, it may be advantageous to impose the further condition that:

$$di_1/dt < 0 < di_2/dt.$$

Substituting the previous expressions for $di_1/dt$ and $di_2/dt$ and simplifying, leads to the relationship:

$$L_2 < M < L_1.$$

With the values for the snubber inductance and the crowbar inductance substantially satisfying this relationship, $di_1/dt$ can be forced negative, thus allowing $i_1$ to be reduced to zero after turning on crowbar switch 27.

If the windings are geometrically similar so that the inductances can be related to the turns-squared by the same constant of proportionality A, then $$L_1 = AN_1^2, \quad L_2 = AN_2^2, \quad M = kAN_1N_2;$$

so that $L_2 < M < L_1$ can be rewritten as $$(N_2/N_1) < k < (N_1/N_2)$$

where k is the coefficient of coupling ($M = k\sqrt{L_1 L_2}$) and k is less than 1, and where $N_1$ and $N_2$ are the number of turns in $L_1$ and $L_2$, respectively.

Since the coupled inductances will typically be air-cored, interleaving may be necessary to achieve the desired degree of coupling. The leads to the dc source are also involved, so the secondary leads should be run close to the GTOs. The secondary winding does not carry current in normal operation; it need only have sufficient thermal capacitance to avoid overheating by the surge current. Therefore, the secondary winding should not increase the size of the reactor by very much.

A numerical example will help to further illuminate the operation of the invention. The snubber inductance $L_1$ is selected to limit the turn-on di/dt of the GTOs during normal inverter operation. GTOs rated to turn off 1000A peak might typically have a di/dt limit of 100A/$\mu$S. $E_d$ may typically be 1000 V, so that $L_1 = 10$ $\mu$H.

If both GTOs 14 and 15 were to conduct simultaneously due to some malfunction, current in snubber inductor 18 would rise at the rate of 100A/$\mu$S. Since the storage time of a GTO of this size is about 10 $\mu$s, the current will have risen from 1000A to 2000A before it could begin to fall, even if turn-off gate drives were begun immediately upon detection of the fault. However, the protective action achieved by the invention begins after only the turn-on delay of crowbar thyristor switch 27 (about 1 $\mu$S).

Assuming that k is about 0.8 and choosing $N_2/N_1 = 0.7$ to satisfy the above relationship, $L_2$ is given a value of 4.9 $\mu$H. Then when crowbar switch 27 turns on in response to a fault, $di_1/dt = -40$ A/$\mu$S and $di_2/dt = 250$ A/$\mu$S. Thus, an initial current $i_1 = 1200$A (allowing for 2 $\mu$S detection and turn-on delay) will be reduced to zero in 30 $\mu$s, turning off the GTOs in the manner of ordinary thyristors. Note that any attempt to turn off by gate action should be suppressed, because one or more snubber capacitors will be charged by spanning action of the inductors so that the capacitive snubbers would be unable to limit dv/dt during GTO turn-off.

The duty of the crowbar switch is quite severe. In the 30 μs required to reduce $i_1$ to zero, $i_2$ will rise to 7500A and will continue to rise until main filter capacitor 13 has discharged. However, a significant amount of resistance can be permitted in the crowbar path to limit the peak current and reduce circulation of reverse current from inductor 18 through the feedback diodes. The crowbar path can be designed to self-extinguish by "ringing filter" action between the crowbar inductance and capacitor 13, wherein the voltage on capacitor 13 reverses to turn off switch 27. Alternatively, the DC supply can be interrupted by a circuit breaker or other means.

Figure 2:
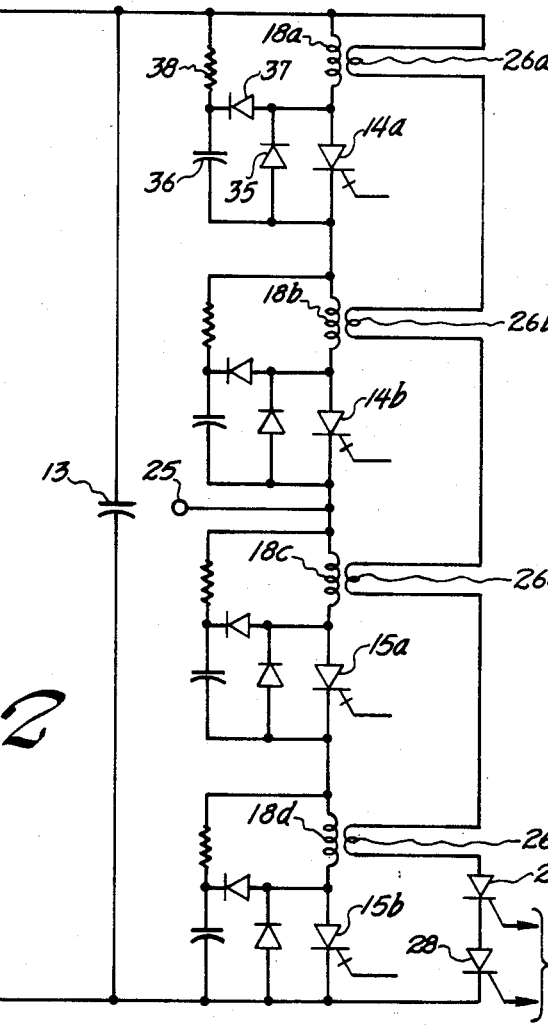
FIG. 2 is a schematic diagram of a phase leg having a series string of switching devices and a modified crowbar circuit.

Referring now to FIG. 2, a single phase leg may comprise a series string of switching devices 14a, 14b, 15a and 15b in order to increase the maximum voltage of the phase leg. Each switching device has its own feedback diode and snubber circuitry. For example, phase leg switch 14a has a series-connected snubber reactor 18a, parallel-connected feedback diode 35 and snubber capacitor 36, a polarizing diode 37 and discharge resistor 38. Snubber reactors 18b, 18c and 18d are connected to phase leg switches 14b, 15a and 15b, respectively. The crowbar inductance includes crowbar windings 26a-26d, each coupled to a respective snubber reactor 18a-18d. Crowbar switches 27 and 28 are connected in series with crowbar windings 18a-18d. Two thyristors are employed to increase the voltage rating of the crowbar path.

The relationship between $L_1$, $L_2$ and M for the embodiment of FIG. 2 is subject to the same conditions as in the previous example. However, the conditions may be considered with respect to either each separate snubber reactor-crowbar winding pair or total values for the phase leg since the two are approximately directly proportional.

Figure 3:
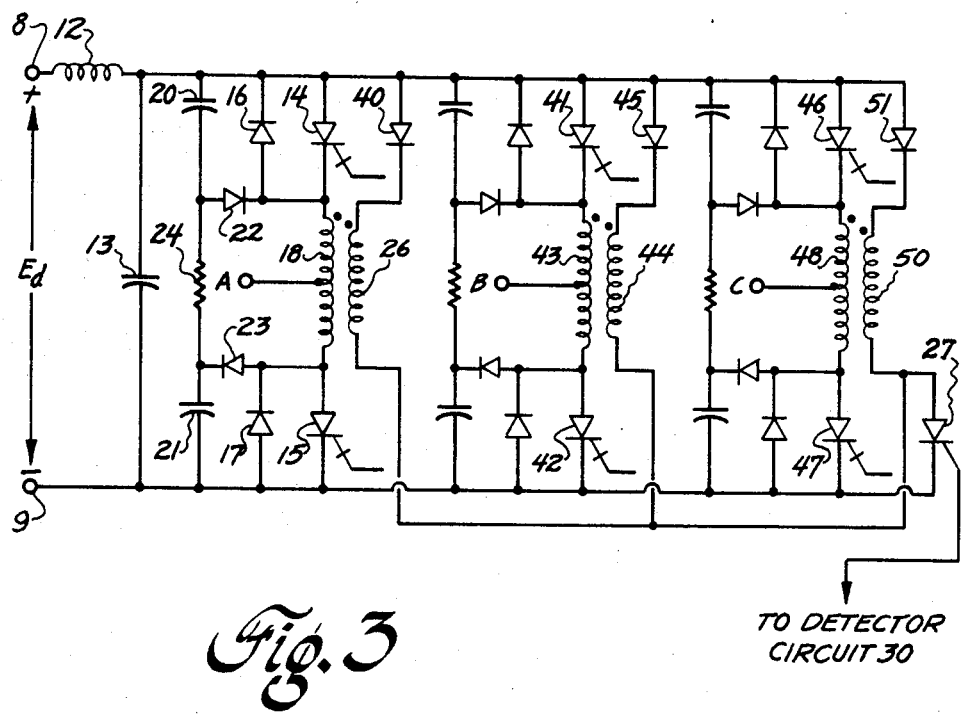
FIG. 3 is a schematic diagram of a three-phase inverter having crowbar windings connected in parallel.
Figure 4:
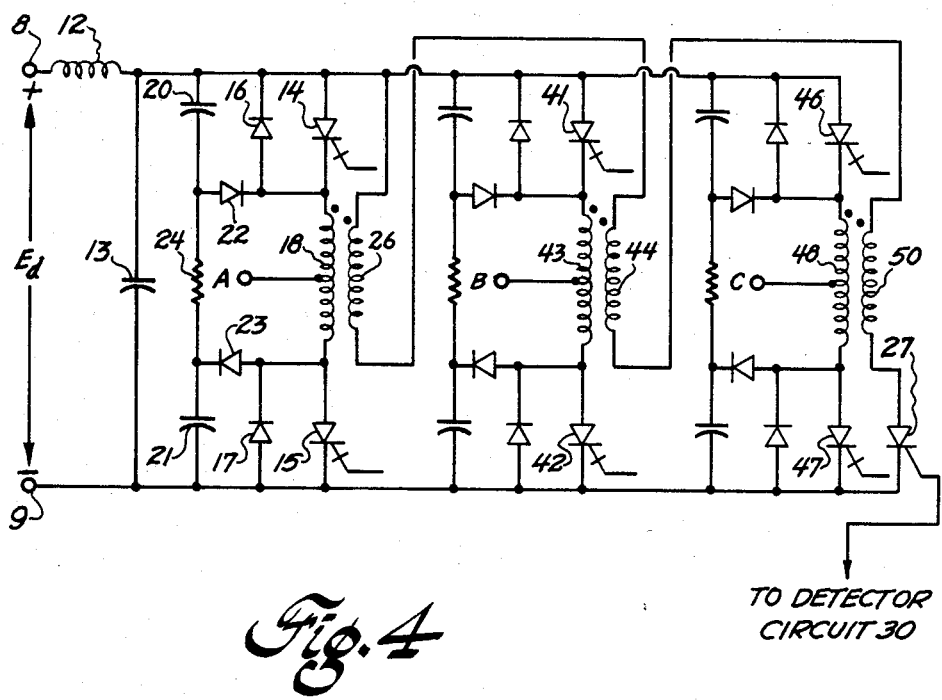
FIG. 4 is a schematic diagram of a three-phase inverter having crowbar windings connected in series.

For multiphase inverters, each phase leg can have a separate crowbar circuit such as the ones shown in FIGS. 1 and 2. Alternatively, a common crowbar switch 27 can be employed as shown in FIGS. 3 and 4. In FIG. 3, crowbar inductances 26, 44 and 50 are connected in parallel and each has a series-connected decoupling diode 40, 45 and 51, respectively, to prevent mutual interference during normal operation. In FIG. 4, crowbar inductances 26, 44 and 50 are connected in series. Thus, no diodes are needed but each crowbar inductance has $N_2/3$ turns, where $N_2$ is determined as previously described and the factor of one-third is introduced because the voltage across each separate crowbar inductance is now one-third of the dc supply voltage. In both examples, the duty of crowbar switch 27 is tripled ($di_2/dt = 750$ A/μS).

Figure 5:
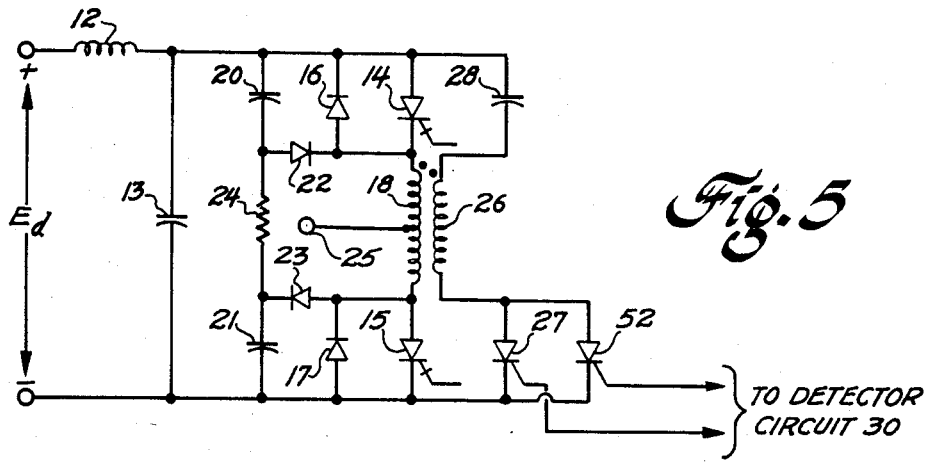
FIG. 5 is a schematic diagram of a phase leg with an auxiliary crowbar capacitor added to the crowbar circuit.

FIG. 5 shows an alternative embodiment including an auxiliary capacitor 28 connected in series with crowbar inductance 26. The effect of capacitor 28 is to stop crowbar action before main filter capacitor 13 fully discharges. Thus, auxiliary capacitor 28 must be large in order in order to allow $i_1$ to fall to zero and possibly reverse during the conventional-thyristor turn-off time of phase leg switches 14 and 15. Capacitor 28 is subject to only occasional duty and can be an electrolytic capacitor.

Figure 6:
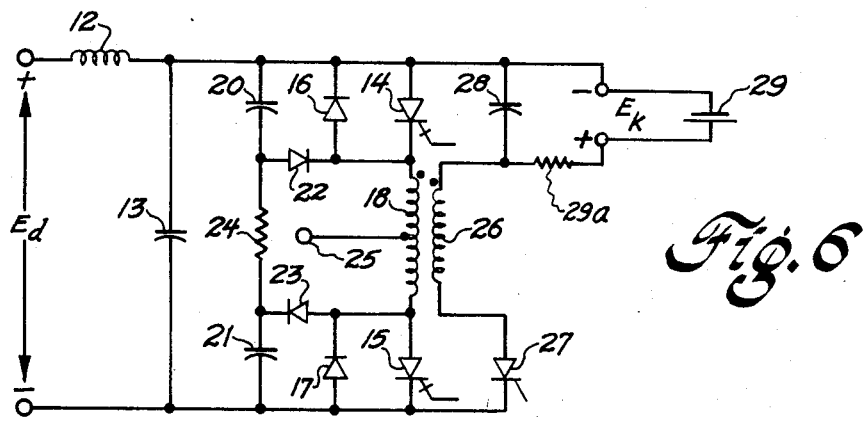
FIG. 6 is a schematic diagram of a phase leg with an auxiliary voltage source connected to the auxiliary capacitor.

FIG. 6 shows an alternative embodiment including an auxiliary voltage source 29 and resistor 29a for precharging auxiliary capacitor 28. This enhances the crowbar action of crowbar inductance 26 and allows for crowbar inductance 26 and snubber inductor 18 to be equal-turn bifilar windings to improve coupling. However, capacitor 28 cannot be a polarized electrolytic capacitor.

Figure 7:
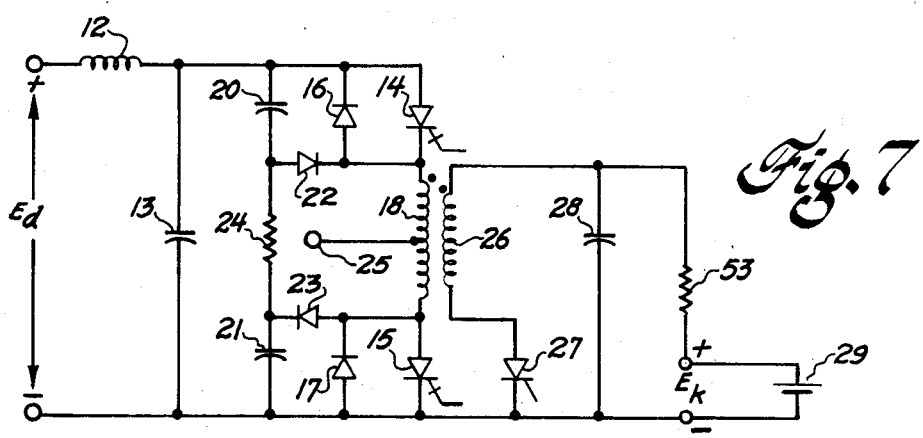
FIG. 7 is a schematic diagram of an alternative connection of the crowbar circuit.

In FIG. 7, the crowbar circuit is isolated from the main DC voltage across capacitor 13. Capacitor 28 is connected in parallel with the series-connected crowbar inductance 26 and switch 27. Auxiliary source 29 and resistor 53 serve to precharge capacitor 28. In operation, energy is transformed from the crowbar circuit to the main DC power supply, so that filter capacitor 13 is not discharged if GTOs 14 and 15 block successfully.

After introducing auxiliary voltage sources and capacitors, the voltage on the crowbar circuit is no longer equivalent to the voltage on the main filter capacitor. Hence, the relationships between $L_1$, $L_2$ and M for ensuring a reduction in $di_1/dt$ must be changed to account for the different voltages. Thus, where the main filter capacitor voltage is $e_1$ and where the crowbar inductance voltage is $e_2$, the design condition for at least reducing $di_1/dt$ becomes:

$$L_1 > M(e_1/e_2),$$

and the condition for giving $di_1/dt$ a negative value is:

$$L_2 e_1 < M e_2,$$

or alternatively, $$L_2(e_1/e_2) < M < L_1(e_2/e_1).$$

In FIG. 5, $e_2$ initially equals $e_1$, but changes as capacitor 28 is charged during crowbar action. Therefore, $L_1$, $L_2$ and M must be selected to provide proper crowbar action as $e_2$ changes. In FIG. 6, $e_2$ is about equal to $E_d + E_k$ and in FIG. 7 $e_2$ is about equal to $E_k$.

Returning to FIG. 5, a modification to the crowbar switch of the invention will be described. Thus, a high-speed thyristor 52 is shown connected in parallel with a high-current thyristor 27. This combination results in improved characteristics for the crowbar switch by utilizing the fast turn-on characteristics of thyristor 52 with the high-current carrying capability of thyristor 27.

The foregoing has described a voltage-source inverter which provides overcurrent fault protection. Fault current is diverted from an inverter phase leg to a crowbar circuit, thus protecting the phase leg switches from damage due to overcurrents. The apparatus provides fault protection with few extra components and with low cost.

While preferred embodiments of the present invention have been shown and described herein, it will be obvious that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A phase leg of an inverter, comprising:

a plurality of series-connected controlled turn-off phase leg switches for coupling to a dc power supply in a series aiding direction and providing an ac output;

inductive snubber means for limiting di/dt during turn-on of said phase leg switches connected in series with said phase leg switches and having an inductance $L_1$;

a crowbar inductance having an inductance $L_2$ and magnetically coupled to said inductive snubber means with a mutual inductance M; and a unidirectionally-conducting crowbar switch connected in said direction in series with said crowbar inductance, said crowbar switch adapted to be turned on upon the onset of an overcurrent fault so as to thereupon conduct crowbar inductance current;

said inductances $L_1$, $L_2$ and M cooperatively reducing the rate of current increase in said phase leg switches when said crowbar switch is turned on.

2. The phase leg of claim 1 wherein said crowbar inductance and said crowbar switch are connected in series across the series combination of said inductive snubber means and said phase leg switches, said inductances $L_1$ and M substantially satisfying the relationship $L_1 > M$.

3. The phase leg of claim 1 wherein said crowbar inductance and said crowbar switch are connected in series across the series combination of said inductive snubber means and said phase leg switches, said inductances $L_1$, $L_2$ and M substantially satisfying the relationship $L_2 < M < L_1$.

4. The phase leg of claim 3 wherein said inductive snubber means and said crowbar inductance are comprised of substantially identical winding geometries, said inductive snubber means having $N_1$ turns, said crowbar inductance having $N_2$ turns, each of said number of turns satisfying the relationship $(N_2/N_1) < k < (N_1/N_2)$, where k is the coefficient of coupling between said inductive snubber means and said crowbar inductance.

5. The phase leg of claim 1 further comprising an auxiliary capacitor connected in series with said crowbar inductance.

6. The phase leg of claim 5 including an auxiliary voltage source connected to said auxiliary capacitor.

7. The phase leg of claim 1 wherein said inductive snubber means includes a plurality of snubber reactors and wherein said crowbar inductance includes a plurality of windings, each winding being magnetically coupled to a respective snubber reactor.

8. The phase leg of claim 1 wherein said crowbar switch is comprised of a thyristor.

9. The phase leg of claim 1 wherein said crowbar switch is comprised of a high-current thyristor connected in parallel with a high-speed thyristor.

10. The phase leg of claim 1 further comprising an auxiliary capacitor connected in parallel with the series combination of said crowbar inductance and said crowbar switch.

11. A voltage-source inverter comprising:
a plurality of parallel-connected phase legs, each leg including a plurality of series-connected phase leg switches for coupling to a dc power supply and inductive snubber means for limiting di/dt during turn-on of said phase leg switches connected in series with said phase leg switches and having an inductance $L_1$, and providing an ac output;

a plurality of crowbar inductances, each having an inductance $L_2$ and magnetically coupled, respectively, to each of said inductive snubber means, respectively, with a mutual inductance M, respectively,; and a crowbar switch coupled to said crowbar inductances for permitting current flow in said crowbar inductances upon the onset of an over-current fault;

said inductances $L_1$, $L_2$ and M cooperatively reducing the rate of current increase in each respective leg when said crowbar switch is turned on.

12. The inverter of claim 11 further comprising detector means for turning on said crowbar switch upon detecting a current in said inverter above a predetermined magnitude.

13. The inverter of claim 1 wherein said crowbar inductances are connected in series.

14. The inverter of claim 11 further including a plurality of decoupling diodes, each of said decoupling diodes, respectively, being connected in series with a respective one of said crowbar inductances, the series combinations of crowbar inductance and decoupling diode being connected in parallel, the parallel connection of said series combinations being connected in series with said crowbar switch.

15. The inverter of claim 11 further comprising a filter capacitor, said crowbar inductances and said crowbar switch being connected in series and coupled across said filter capacitor.

16. A method for providing overload protection in a voltage-source inverter, said inverter including at least one phase leg having a plurality of series-connected phase leg switches for coupling to a dc power supply of voltage $e_1$ and an inductive snubber means for limiting di/dt during turn on of said phase leg switches connected in series with said phase leg switches and having an inductance $L_1$, said inverter further including a crowbar inductance having an inductance $L_2$ magnetically coupled to said inductive snubber means with a mutual inductance M, and a crowbar switch connected in series with said crowbar inductance, said crowbar inductance receiving a voltage $e_2$ when said crowbar switch is turned on, said method comprising the steps of:

(1) detecting an overcurrent fault;
(2) turning on said crowbar switch so that at least a portion of said overcurrent flows in said crowbar inductance; and
(3) turning off said phase leg switches by reducing current in said inductive snubber means to substantially zero by virtue of said inductances $L_1$, $L_2$ and M satisfying the relationship $L_2 (e_1/e_2) < M < L_2 (e_2/e_1)$.

17. The method of claim 16 further comprising the step, after step 3, of reversing the voltage across said crowbar switch by ringing filter action between said crowbar inductance and a capacitor connected to said crowbar inductance, so as to turn off current flow in said crowbar switch.

18. The method of claim 16 further comprising the step, after step 3, of interrupting current flow from said dc power supply after current in said phase leg switches is reduced to zero.

19. A method for providing overload protection in a voltage-source inverter, said inverter including at least one phase leg having a plurality of series-connected phase leg switches for coupling to a dc power supply of voltage $e_1$ and an inductive snubber means for limiting di/dt during turn on of said phase leg switches connected in series with said phase leg switches and having an inductance $L_1$, said inverter further including a crowbar inductance having an inductance $L_2$ magnetically coupled to said inductive snubber means with a mutal inductance M, and a crowbar switch connected in series with said crowbar inductance, said crowbar inductance receiving a voltage $e_2$ when said crowbar switch is turned on, said method comprising the steps of:

(1) detecting an overcurrent fault;
(2) turning on said crowbar switch so as to divert from said inductive snubber means through said crowbar inductance at least a portion of said overcurrent; and
(3) limiting current in said phase leg switches and in said inductive snubber means by virtue of said inductances $L_1$, $L_2$ and M satisfying the relationship $M < L_1(e_2/e_1)$.

* * * * *